United States Patent
Hantschel

(10) Patent No.: US 12,243,994 B2
(45) Date of Patent: Mar. 4, 2025

(54) CONTROL DEVICE

(71) Applicant: ElringKlinger AG, Dettingen an der Erms (DE)

(72) Inventor: Jochen Hantschel, Dettingen an der Erms (DE)

(73) Assignee: ElringKlinger AG, Dettingen an der Erms (DE)

( * ) Notice: Subject to any disclaimer, the term of this patent is extended or adjusted under 35 U.S.C. 154(b) by 567 days.

(21) Appl. No.: 17/628,504

(22) PCT Filed: Jul. 24, 2020

(86) PCT No.: PCT/EP2020/071041
§ 371 (c)(1),
(2) Date: Jan. 19, 2022

(87) PCT Pub. No.: WO2021/014016
PCT Pub. Date: Jan. 28, 2021

(65) Prior Publication Data
US 2022/0294042 A1 Sep. 15, 2022

(30) Foreign Application Priority Data
Jul. 24, 2019 (DE) .......................... 102019120031.8

(51) Int. Cl.
*H01M 10/613* (2014.01)
*H01M 10/625* (2014.01)
(Continued)

(52) U.S. Cl.
CPC ..... *H01M 10/613* (2015.04); *H01M 10/6551* (2015.04); *H01M 50/233* (2021.01); *H01M 10/625* (2015.04); *H01M 2220/20* (2013.01)

(58) Field of Classification Search
CPC .......... H01M 10/613; H01M 10/6551; H01M 50/233; H01M 10/625; H01M 2220/20
(Continued)

(56) References Cited

U.S. PATENT DOCUMENTS

2002/0197527 A1* 12/2002 Moores, Jr. ......... H01M 10/652
429/96
2004/0207368 A1 10/2004 Kimoto et al.
(Continued)

FOREIGN PATENT DOCUMENTS

DE 102012209744 A1 11/2013
DE 102012216916 A1 3/2014
(Continued)

OTHER PUBLICATIONS

German Office Action and search report for DE102019120031.8, Issued on Apr. 22, 2020, Total of 8 pages.
(Continued)

*Primary Examiner* — Christian Roldan
*Assistant Examiner* — Robert Gene West

(57) ABSTRACT

A control device for a battery storage device, which is equipped with components of the electronics system, e.g. battery management system and current measurement shunt, and with components of the electromechanical system, e.g. in the form of relays, fuses, bus bars, and plug connectors, and is accommodated in a closed housing. In order to create a control device in which a predetermined service life can be reliably achieved even without an oversizing of components, it is proposed for the closed housing to be embodied to form a free and/or forced convection, it being possible for the convection to balance out temperature differences inside the housing and throughout the control device.

11 Claims, 2 Drawing Sheets

(51) Int. Cl.
   *H01M 10/6551*   (2014.01)
   *H01M 50/233*    (2021.01)
(58) Field of Classification Search
   USPC .......................................................... 429/120
   See application file for complete search history.

(56) References Cited

U.S. PATENT DOCUMENTS

| | | |
|---|---|---|
| 2004/0232891 A1 | 11/2004 | Kimoto et al. |
| 2010/0039771 A1 | 2/2010 | Marchand |
| 2012/0087091 A1* | 4/2012 | Nassoiy ............ H01M 10/6568 361/701 |
| 2015/0022972 A1 | 1/2015 | Kwon |
| 2017/0188488 A1 | 6/2017 | Takezawa et al. |
| 2018/0069281 A1* | 3/2018 | Tutzer ............... H01M 10/6567 |

FOREIGN PATENT DOCUMENTS

| | | |
|---|---|---|
| DE | 102012110001 A1 | 4/2014 |
| DE | 102017104007 A1 | 8/2018 |
| EP | 3214721 A1 | 9/2017 |
| EP | 3404795 A1 | 11/2018 |

OTHER PUBLICATIONS

International Search Report for PCT/EP2020/071041, Issued on Nov. 4, 2020, Total of 6 pages.

\* cited by examiner

CONTROL DEVICE

CROSS-REFERENCE TO RELATED APPLICATIONS

This application is a U.S. National Phase of International Application No. PCT/EP2020/071041, filed on Jul. 24, 2020, which claims priority to German Patent Application No. 102019120031.8, filed on Jul. 24, 2019. The entire contents of each of the above-listed applications are hereby incorporated by reference for all purposes.

TECHNICAL FIELD

The present invention relates to a control device for a battery storage device.

BACKGROUND AND SUMMARY

In addition to stationary applications as emergency power supplies and buffers for peak loads, today, large battery storage devices are regularly also used in electric vehicles as a replacement for a drive by means of internal combustion engines. In addition to the closed units in the form of battery cells or battery modules and elements for electrically connecting these modules, these battery storage devices also contain a control device, which is usually housed in a separate housing section or in a housing entirely separate therefrom inside the battery storage device. Such a control device is equipped with components of the electronics system, e.g. battery management system, current measurement shunt, and components of the electromechanical system, e.g. in the form of relays, fuses, bus bars, plug connectors, etc. According to the prior art, such a control device is accommodated for safety reasons in its own housing section or even in an additional closed housing separate from the cells of the battery storage device. In this case, all of the components mentioned above by way of example are mounted therein on a base plate or a circuitry supporting element made of plastic. For high voltage safety reasons, such a housing section is embodied with its own matching plastic piece so that it is protected from contact and, through the formation of the additional closed housing inside a module housing, is also closed off from the immediate external surroundings. In this case, battery storage device systems of the above-mentioned type for electric vehicles are generally water-cooled to carry away lost heat and have a cooling conduit structure through which fluid flows, usually in the vicinity of the bottom of a module housing.

A particular challenge now arises due to the fact that the electrical components contained, as a sum composed of pure electronics, bus bars, fuses, relays, etc., sometimes produce not insignificant amounts of lost heat. This is particularly true when the battery system is subjected to high currents. The support and cover of the control device that are used and that enclose the electrical components, however, due to their low thermal conductivity, additionally complicate the task of extracting heat from the electrical components mentioned by way of example in that they drastically reduce a large-area heat dissipation to surrounding metallic housing components for the simple reason that they constitute a contact protection. This situation results in the formation of so-called heat nests, which is very disadvantageous or even counterproductive for a reliable, long-term operation, particularly in electronic components due to a rapid increase in the probability of failure associated with the temperature and also in nonrenewable fuses due to a negative influence of a tripping characteristic.

Redundant units can be provided in the control device to prevent premature failure of electronic components. Alternatively, a powerful heating of an electrical fuse requires a so-called "derating," i.e. designing for a higher rated current. In other words, according to the prior art, the electrical components used must be intentionally oversized in order to factor in the higher temperatures in the event of a higher load. One can alternatively accept a higher probability of failure. The above-mentioned design approaches, however, result in a greater space requirement and higher costs, provided that this is even achievable in the generally cramped space conditions in a module housing. A reduced service life likewise results in higher costs and reduced reliability and therefore cannot seriously be considered as a solution.

The object of the present invention, therefore, is to create a control device in which a predetermined service life can be reliably achieved even without the oversizing of components.

This object is attained according to the disclosure with a closed housing that is embodied so as to form a free and/or forced convection by means of which it is possible to balance out temperature differences inside the housing and throughout the control device.

In other words, the invention is essentially based on the realization that a formation of heat nests is promoted by the fact that it is almost impossible for natural or free convection to form inside the closed housing of the control device. A corresponding embodiment of the closed housing that enables the formation of a free and/or forced convection vigorously counteracts a formation of distinct heat nests. As a result, at least temperature differences inside the housing are balanced out, which allows the components to function at normal thermal operating points.

Advantageous modifications are indicated below. A supporting element serving as a base of the control device inside the closed housing is therefore embodied so that along a longitudinal axis or in the longitudinal direction of the housing, this supporting element forms a free flow cross-section that is elevated relative to a bottom of the closed housing serving as part of a module housing.

In a preferred embodiment of the invention, an inlet of the free flow cross-section constitutes a direct receptacle for a device fan, which is in particular actively electrically driven and possibly also electrically controlled.

It is also preferable for an opening to be provided between a lower part formed by the supporting element and an upper part of the closed housing of the control device, which opening is positioned at an end of the supporting element opposite from the device fan. This produces a maximal length of a free flow cross-section that is available for the convection inside the closed housing of the control device. This flow path extends in a virtually closed path around the supporting element.

In the closed housing, a removal of the heat of the control device that has been absorbed by means of convection is advantageously provided by means of a heat exchanger. In this embodiment of the invention, it is not just a uniform distribution of lost heat throughout the control device that is sought; a convectively absorbed heat is also intentionally removed from the closed housing of the control device.

In a preferred embodiment of the invention, an underside of the free flow cross-section is directly embodied as a heat exchanger and specifically to produce a flow across a cooling plate of the battery modules of the relevant battery storage device.

The supporting element is embodied as a plastic support preferably in such a way that its supporting geometry is able not only to favorably accommodate, support, and secure the components mentioned above by way of example, but also constitutes a partition wall between an upper and lower volume of the closed housing; on the side opposite from the upper side that supports the components, the plastic support has openings for air to flow out from the lower housing half into the upper housing half. In one embodiment of the invention, these openings are also positioned directly underneath particularly lossy components, in particular nonrenewable fuses or shunts, for selective heat extraction by means of convection.

With an embodiment of a control device according to the invention, a directed flow is produced inside the whole closed housing section. A heat nest formation is effectively prevented. The flow across the extended battery module cooling plate causes a direct heat exchange of the circulated air with the cooling system to take place. Particularly lossy components can be provided with additional, more intensive cooling by means of dedicated outflow openings provided directly underneath these components. It is thus easily possible to even use a plastic housing that is completely closed around the control device.

According to the invention, a supporting element is created in the form of a plastic support serving as a base of the control device and thus as an essential part inside the closed housing; the supporting element a. is embodied as an electrically insulated plastic component, preferably an injection molded part;

b. is embodied as a supporting part in a lower housing section in such a way that it accommodates and mechanically secures electrical components and is itself also secured inside the closed housing, preferably by means of supports formed onto it or separate legs, which in an installed position, rest against approximately opposite regions of the closed housing; alternatively, projections and/or shoulders functioning as defined supports of the supporting element in an installed position are provided in the closed housing;

c. creates a flow cross-section, which reaches a length extending from one end of the closed housing of the control device to the other;

d. has a receptacle for a housing fan;

e. has dedicated and appropriately oriented outflow openings for components with high losses in order to provide a flow directly against them for heat extraction purposes;

f. has a flow cross-section, which is open on an underside oriented toward a cooling plate and reaches in a longitudinal direction from one end of the volume to the other in order to transport an air flow and enable the heat exchange with the cooling plate positioned thereunder.

With a supporting element of the above-mentioned type, the closed housing of the control device constitutes a system with an advantageously minimal housing volume, comprising a lower plastic supporting/air baffle plate, an upper plastic plate, electrical components to be cooled, a housing fan mounted on or against the supporting element, and liquid-filled cooling plates, which are provided extending over an area underneath the lower plastic support. In other words, the supporting element has an equipped upper side and a non-equipped underside; the underside is embodied to be positioned opposite a heat exchanger in an installed position.

BRIEF DESCRIPTION OF THE FIGURES

Additional features and advantages of embodiments according to the invention will be explained in greater detail below with reference to exemplary embodiments based on the drawings. In the schematic drawings.

DETAILED DESCRIPTION

Figure 1:
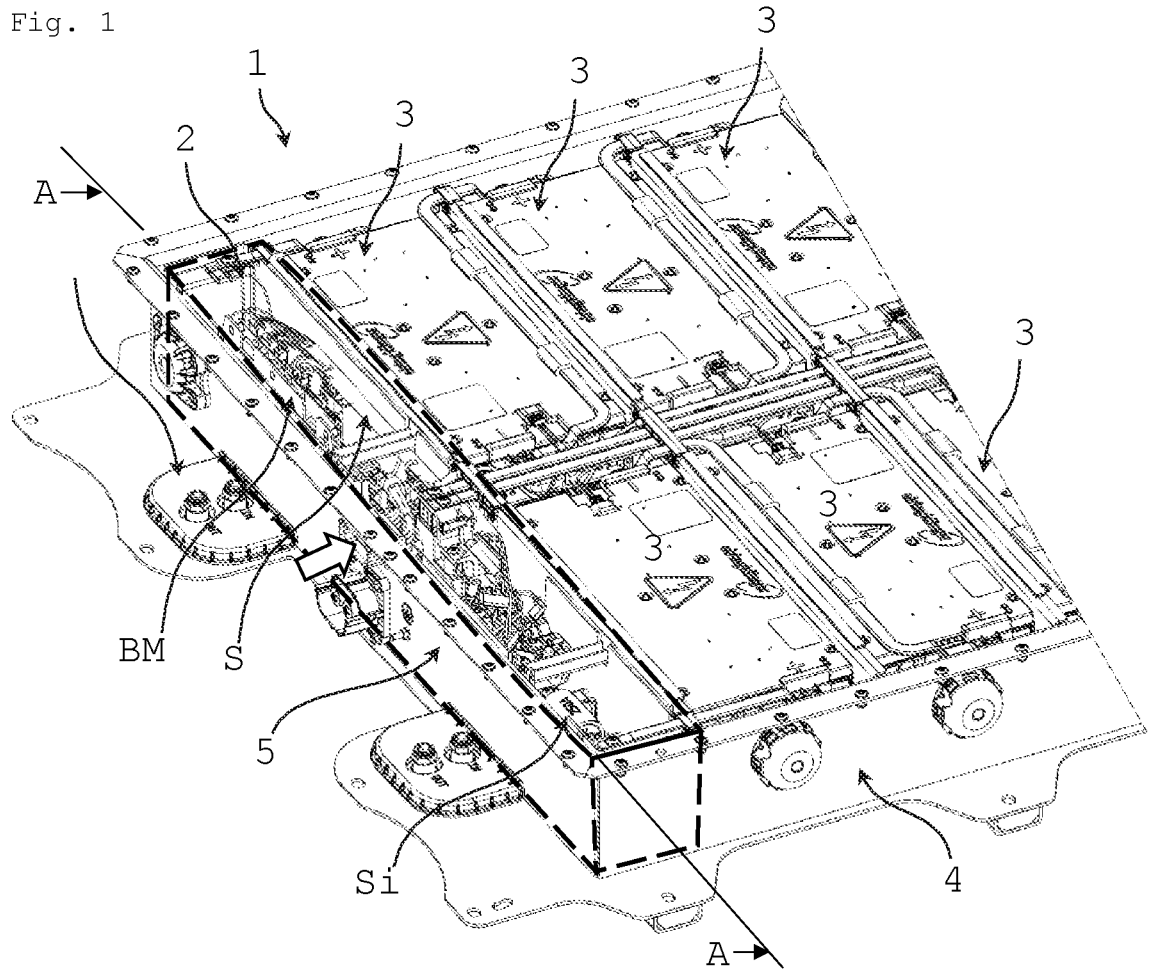
FIG. 1 shows a perspective view of a part of a battery storage device with a control unit and a plurality of electric storage cells.

The same reference numerals are always used for the same elements throughout the different drawings. Without limiting the field of use, the discussion below will focus only on a use of a device according to the invention in a vehicle. It is, however, very clear to the person skilled in the art that because of high currents and corresponding requirements for contact prevention, devices according to the invention can also be used very advantageously in stationary energy storage devices, particularly in connection with wind power and/or photovoltaic systems.

The diagram in FIG. 1 shows a perspective view of a part of a battery storage device 1 with a control device 2 and a plurality of electric storage cells 3. In this case, the control unit 2 is physically separated from storage cells 3 by a module housing 4 in a separate housing 5 that is closed off from the rest of the battery storage device 1.

In addition to components of the electronics system, e.g. an electronic battery management system BM with power semiconductors and current measurement shunts, the closed housing 5 also accommodates components of the electromechanical system, e.g. in the form of relays, fuses Si, bus bars S, and plug connectors. In order to create a control device 2 without an oversizing of at least some of its components that are mentioned above only by way of example, in order to reliably achieve a predetermined service life of these components, the closed housing 5 is embodied so as to form a free and/or forced convection. By means of the convection, it is possible to balance out temperature differences inside the housing 5 such that all of the components are operated in normal temperature ranges and can thus achieve their predetermined service life. In addition to eliminating increased costs, this also effectively saves on the need for installation space, which is only ever very rarely available.

Figure 2:
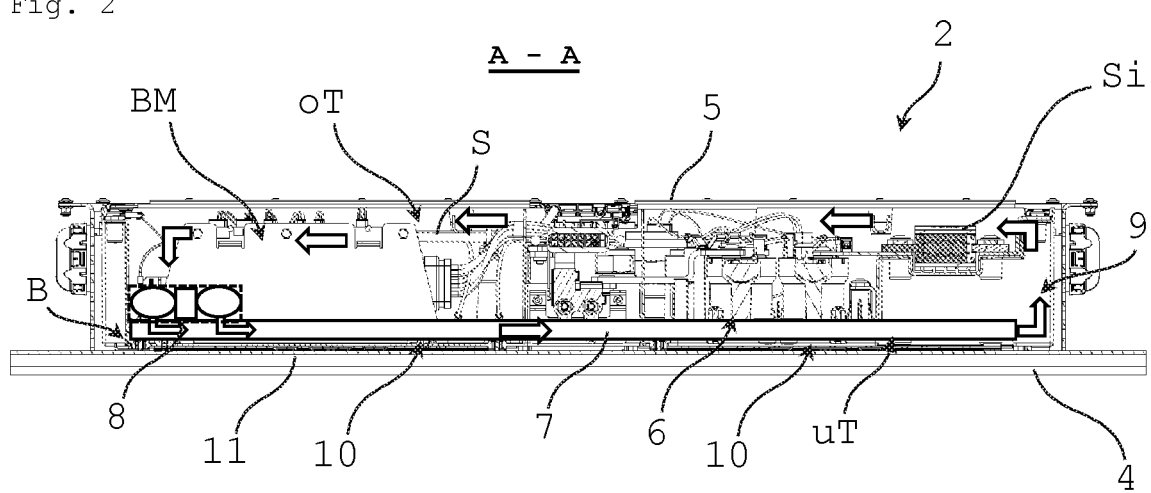
FIG. 2 shows a side view of the battery storage device from FIG. 1.

The depiction in FIG. 2, with a side view of the battery storage device 1 from FIG. 1 shows a path, indicated with arrows, of a convection inside the closed housing 5 of the control device 2. In order to achieve the intentional formation of the convection, a supporting element 6, which constitutes a base for the control device 2 inside the closed housing 5, is embodied to function as a mechanical support for all of the components and to secure them inside the closed housing 5. The supporting element 6 is embodied in the form of a plastic component so that along a longitudinal axis or in the longitudinal direction of the housing 5, it produces a free flow cross-section 7 that is elevated relative to a bottom B of the module housing 4. For this purpose, the supporting element 6 has supports formed onto it or legs, which in an installed position are barely visible in the drawing because the supporting element 6 is densely equipped with numerous components of the control device 2, and like a partition wall, divides an upper part oT of the volume of the closed housing 5 for the control device 2 from a lower part uT. The lower part uT serving as a free flow cross-section 7 then closes a loop of the convection.

In order to produce a forced convection, a receptacle is provided at an inlet of the free flow cross-section 7 and a device fan 8, which is electrically driven in an active, controlled fashion, is positioned therein. In addition, an opening 9 is provided between the lower housing part uT and upper part oT of the closed housing 5 of the control device 2, which opening is positioned at an end of the supporting element 6 opposite from the device fan 8. It is thus possible to form a flow essentially for the entire length of the closed housing 5. An underside of the free flow cross-section 7 is also directly embodied as a heat exchanger 10 by means of a flow across of a cooling plate 11 of the battery modules or electric storage cells 3.

Not shown in greater detail in the images in the figures, special openings, which are provided extending from the lower housing part uT through the supporting element 6 that constitutes a partition wall between the upper and lower volumes of the closed housing 4, are intentionally positioned at or under components with particularly high electrical heat losses or are especially directed at them. This makes it possible to achieve a selective heat extraction with a point-by-point, so to speak, removal of the electrical heat losses inside the closed housing 5.

Figure 3:
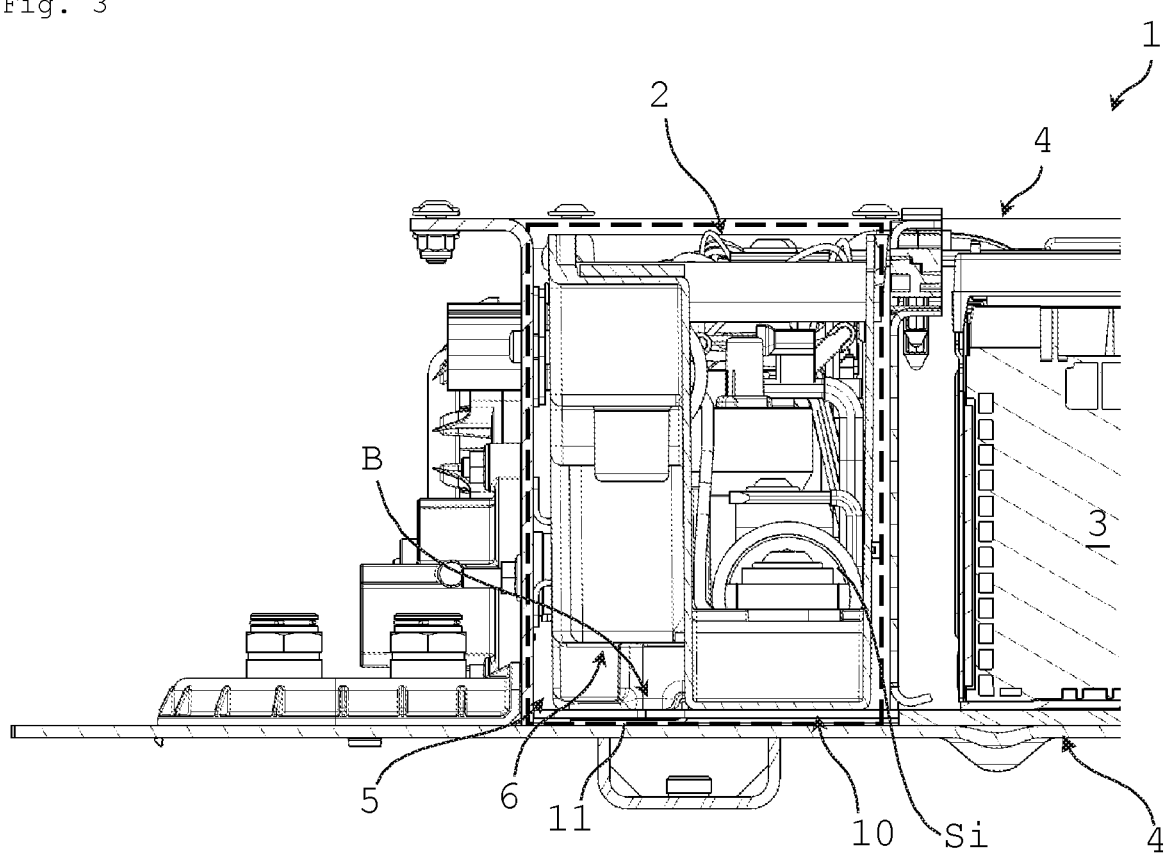
FIG. 3 shows a view of a longitudinal side of FIG. 1 in a cut-away view.

The drawing in FIG. 3 is a view of a longitudinal side of FIG. 1 in a cut-away view and, through the clearly optimized utilization of the generally tight installation space, emphasizes the fact that through an above-described embodiment of a supporting element 6, the advantages of a space-saving, compact design of the control device 2 are retained. In addition, such an embodiment enables the formation of a thermal balancing with a significant reduction in the development of thermal nests accompanied by an extensive elimination of the possibility of local or regional overheating phenomena during the operation of the control device 2. But it is not just a thermal balancing inside the closed housing 5 of the control device 2 that is achieved; instead, without additional expense, a cooling plate 10 provided for the cooling of battery modules or electric storage cells 3 is also advantageously used to transport heat out of the closed housing 5 as part of the module housing 4.

REFERENCE NUMERAL LIST 1 battery storage device
2 control device
3 electric storage cell
4 module housing
5 closed housing
6 supporting element/partition
7 free flow cross-section
8 device fan
9 opening
10 fluid-heat exchanger in the module housing 4
11 cooling plate
B bottom
BM battery management system
S conductor rail
Si fuse
oT upper part of the closed housing 5
uT lower part of the closed housing 5

The invention claimed is:

1. A control device of a battery storage device, comprising components of an electronics system and components of an electromechanical system, the control device is accommodated as a unit in a closed housing and the closed housing physically separates the control device from electric storage cells within a closed module housing of the battery storage device, and
   wherein the closed housing is embodied to form a free and/or forced convection so that the convection balances out temperature differences inside the closed housing of the control device and throughout the control device, and
   wherein a supporting element constitutes a base of the control device inside the closed housing, with the components of an electronics system and the components of an electromechanical system secured on top of the supporting element, and the supporting element is embodied as a plastic support so that along a longitudinal axis and in a longitudinal direction of the closed housing, the supporting element forms a free flow cross-section that is elevated relative to a bottom of the closed module housing, and a flow path of air extends in a virtually closed path around the supporting element.

2. The control device according to claim 1, wherein a device fan, which is electrically driven in an active fashion, is provided at an inlet of the free flow cross-section within the closed housing of the control device.

3. The control device according to claim 2, wherein an opening is provided between a lower housing part and an upper housing part of the closed housing of the control device, which is provided at an end of the supporting element opposite from the device fan.

4. The control device according to claim 3, wherein in the closed housing of the control device, a removal of the heat that has been absorbed by means of convection is provided by means of a heat exchanger.

5. The control device according to claim 4, wherein an underside of the free flow cross-section is directly embodied as a heat exchanger of the closed module housing.

6. The control device according to claim 5, wherein the underside of the free flow cross-section is embodied to produce a flow across a cooling plate of battery modules or electric storage cells in the battery storage device.

7. The control device according to claim 3, wherein the supporting element in the lower housing part forms a partition wall between an upper and lower volume of the closed housing of the control device.

8. The control device according to claim 7, wherein this partition wall has openings for air to flow out into the upper housing part.

9. The control device according to claim 8, wherein the openings are positioned in close proximity to components with electrical heat losses and are facing the components with electrical heat losses.

10. The control device according to claim 1, wherein the components of an electronics system comprise an electronic battery management system with power semiconductors and current measurement shunts.

11. The control device according to claim 1, wherein the components of an electromechanical system include at least one of the group consisting of: relays, fuses, bus bars, and plug connectors.

* * * * *

UNITED STATES PATENT AND TRADEMARK OFFICE
CERTIFICATE OF CORRECTION

PATENT NO. : 12,243,994 B2
APPLICATION NO. : 17/628504
DATED : March 4, 2025
INVENTOR(S) : Jochen Hantschel Page 1 of 1

It is certified that error appears in the above-identified patent and that said Letters Patent is hereby corrected as shown below:

In the Claims

Claim 1, Line 23: please delete "virtually".

Signed and Sealed this
Ninth Day of September, 2025

Coke Morgan Stewart
*Acting Director of the United States Patent and Trademark Office*